United States Patent
Kim

(10) Patent No.: US 9,613,972 B1
(45) Date of Patent: Apr. 4, 2017

(54) METHOD OF MANUFACTURING SEMICONDUCTOR DEVICE

(71) Applicant: SK hynix Inc., Icheon-si Gyeonggi-do (KR)

(72) Inventor: Jong Hoon Kim, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/080,700

(22) Filed: Mar. 25, 2016

(30) Foreign Application Priority Data

Oct. 8, 2015  (KR) .......................... 10-2015-0141573

(51) Int. Cl.

| | | |
|---|---|---|
| *H01L 27/146* | (2006.01) | |
| *H01L 27/11524* | (2017.01) | |
| *H01L 21/28* | (2006.01) | |
| *H01L 21/3205* | (2006.01) | |
| *H01L 21/311* | (2006.01) | |
| *H01L 21/3213* | (2006.01) | |
| *H01L 21/3105* | (2006.01) | |

(52) U.S. Cl.
CPC .. *H01L 27/11524* (2013.01); *H01L 21/28273* (2013.01); *H01L 21/31053* (2013.01); *H01L 21/31111* (2013.01); *H01L 21/32053* (2013.01); *H01L 21/32133* (2013.01)

(58) Field of Classification Search
CPC ......... H01L 2924/0002; H01L 2924/00; H01L 23/544; H01L 21/78; H01L 21/7684; H01L 21/76883; H01L 2223/54426; H01L 29/66545
See application file for complete search history.

(56) References Cited

U.S. PATENT DOCUMENTS

| | | | | |
|---|---|---|---|---|
| 2004/0219439 | A1* | 11/2004 | Asano ................. | G03F 7/70466 430/5 |
| 2007/0008533 | A1* | 1/2007 | Ghinovker .......... | G03F 7/70633 356/401 |
| 2007/0072386 | A1* | 3/2007 | Kim ...................... | H01L 23/544 438/400 |
| 2007/0090549 | A1* | 4/2007 | Kudo .................... | G03F 9/7076 257/797 |
| 2008/0096113 | A1* | 4/2008 | Naoe ........................ | G03F 1/84 430/5 |
| 2009/0305505 | A1* | 12/2009 | Park ...................... | H01L 23/544 438/694 |

(Continued)

FOREIGN PATENT DOCUMENTS

KR   100695876 B1   3/2007

*Primary Examiner* — Jaehwan Oh

(74) *Attorney, Agent, or Firm* — William Park & Associates Ltd.

(57) ABSTRACT

In an embodiment of the present disclosure, a method of manufacturing a semiconductor device may include forming a pattern group on a substrate, the substrate being divided into first and second regions, each pattern including a silicon layer, forming an insulating pattern on the substrate, the insulating pattern partially exposing the silicon layer on the first region and blocking the silicon layer on the second region, converting the exposed silicon layer on the first region to a silicide layer while the blocked silicon layer on the second region is protected from the conversion, and performing a subsequent process using, as an overlay vernier, at least a portion of the pattern group formed on the second region.

14 Claims, 6 Drawing Sheets

(56) References Cited

U.S. PATENT DOCUMENTS

| | | | |
|---|---|---|---|
| 2012/0146195 A1* | 6/2012 | Lee | H01L 23/544 |
| | | | 257/635 |
| 2013/0120739 A1* | 5/2013 | Dai | G03F 7/70633 |
| | | | 356/72 |
| 2013/0161722 A1* | 6/2013 | Son | H01L 29/78 |
| | | | 257/321 |
| 2014/0264961 A1* | 9/2014 | Huang | G03F 7/70633 |
| | | | 257/797 |
| 2015/0364517 A1* | 12/2015 | Onuki | H01L 27/14612 |
| | | | 257/292 |
| 2015/0371957 A1* | 12/2015 | Wang | H01L 23/562 |
| | | | 257/620 |
| 2016/0025484 A1* | 1/2016 | Kim | G03F 7/70633 |
| | | | 356/614 |

\* cited by examiner

FIG. 1A
FIG. 1B
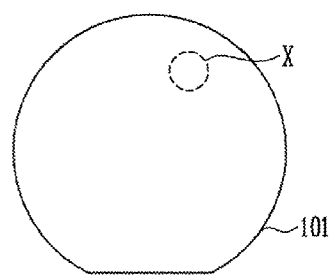
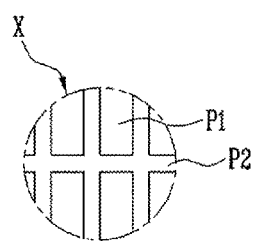
FIG. 2
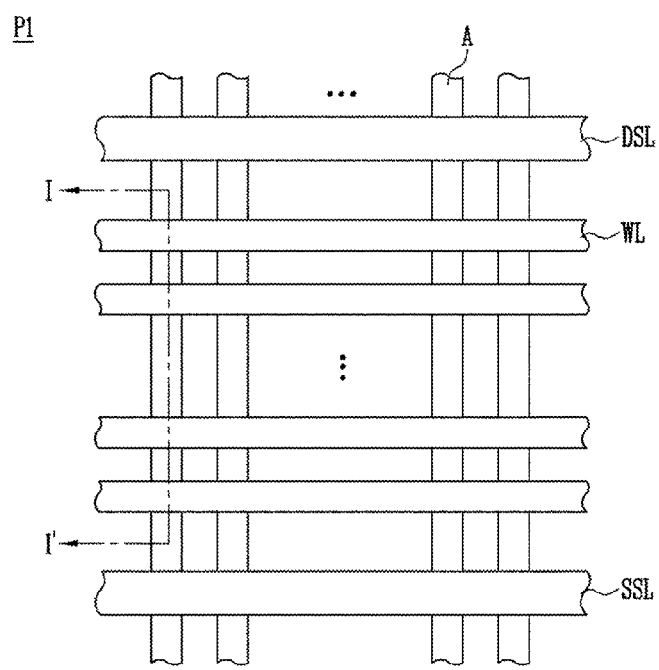

METHOD OF MANUFACTURING SEMICONDUCTOR DEVICE

CROSS-REFERENCE TO RELATED APPLICATION

The present application claims a priority under 35 U.S.C. §119(a) to a Korean patent application number 10-2015-0141573 filed on Oct. 8, 2015, in the Korean Intellectual Property Office, the entire disclosure of which is incorporated herein by reference.

BACKGROUND

1. Technical Field

Various embodiments of the present disclosure generally relate to a method for manufacturing a semiconductor device, and, more particularly, to a method for manufacturing a semiconductor device using an overlay vernier.

2. Related Arts

A semiconductor device having cell transistors may include various driver circuits to drive the cell transistors. The processing steps of semiconductor device fabrication may include patterning. The cell transistors and the driver circuits may be formed with patterns stacked at different levels. Each pattern at each level may be formed by a masking process. The masking process may include a deposition of material layers to be etched and a patterning of the material layers using an exposure mask. When the cell transistors and the driver circuits are formed using multiple masking processes, an alignment accuracy between the patterns formed by different masking processes may be checked. In order to check the alignment accuracy, an overlay vernier may be employed.

SUMMARY

In an embodiment of the present disclosure, a method of manufacturing a semiconductor device may include forming a pattern group on a substrate, the substrate being divided into first and second regions, each pattern including a silicon layer, forming an insulating pattern on the substrate, the insulating pattern partially exposing the silicon layer on the first region and blocking the silicon layer on the second region, converting the exposed silicon layer on the first region to a silicide layer while the blocked silicon layer on the second region is protected from the conversion, and performing a subsequent process using, as an overlay vernier, at least a portion of the pattern group formed on the second region.

In an embodiment of the present disclosure, a method of manufacturing a semiconductor device may include forming preliminary patterns on a first region of a substrate, forming an overlay vernier pattern on a second region of the substrate, forming dummy patterns on the second region, a density of the dummy patterns being higher than that of the preliminary patterns, forming an insulating pattern on the first and second regions of the substrate, the insulating pattern partially exposing the preliminary patterns on the first region and covering the overlay vernier pattern on the second region.

BRIEF DESCRIPTION OF THE DRAWINGS

FIG. 1A and FIG. 1B illustrate examples of first and second regions of a substrate according to an embodiment of the present disclosure.

FIG. 2 is a plan view illustrating examples of patterns disposed on the first region of the substrate according to an embodiment of the present disclosure.

DETAILED DESCRIPTIONS

Figure 3:
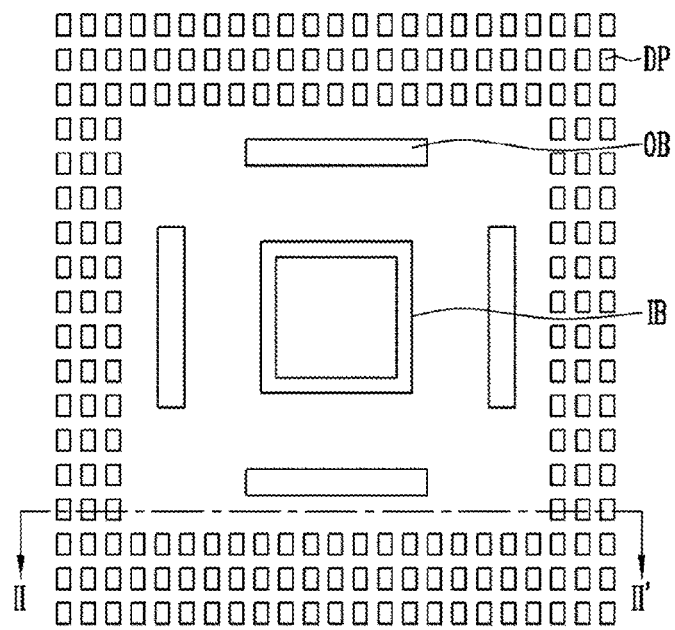
FIG. 3 is a plan view illustrating examples of vernier patterns and dummy patterns on the second region of the substrate according to an embodiment of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1A and FIG. 1B illustrate examples of first and second regions of a substrate according to an embodiment of the present disclosure. FIG. 1B illustrates an enlarged view of an X region in FIG. 1A.

Referring to FIG. 1A and FIG. 1B, a substrate 101 may include a semiconductor wafer. The substrate 101 may include first regions P1 and a second region P2.

Main patterns may be formed on each of the first regions P1. The main patterns may make up cell transistors and driver circuits of the semiconductor device. The first regions P1 each may define a chip region.

Test patterns, vernier patterns and dummy patterns, which are not involved in substantial operations of the semiconductor device, may be formed on the second region P2. Examples of the second region P2 may include a scribe lane region that divides the first region into the multiple chip regions.

The main patterns disposed on the first regions P1 and the vernier patterns and dummy patterns disposed on the second region P2 may be formed using multiple masking processes. The vernier patterns and dummy patterns may be formed using one of masking processes for forming the main patterns.

Hereinafter, a first-process pattern group may refer to a group of patterns formed using a first single masking process. A second-process pattern group may refer to a group of patterns formed using a second single masking process. The first process may be different from the second process. Each pattern of the first-process pattern group may include a silicon layer. In other words, each pattern of the first-process pattern group may include a material that will form a silicide. The second-process pattern group may be formed after the formation of the first-process pattern group.

Although the example of the first-process pattern group discussed below may include gate patterns of a NAND flash memory device, the present disclosure is not limited thereto.

A method of manufacturing the semiconductor device according to an embodiment of the present disclosure may include forming, on the substrate 101, the main patterns, which form the cell transistors and driver circuits, and dividing the substrate 101 by the second region P2, which is the scribe lane region.

FIG. 2 is a plan view illustrating examples of patterns disposed on the first region of the substrate according to an embodiment of the present disclosure. More specifically, FIG. 2 is a plan view illustrating gate patterns of a NAND flash memory device provided as an example of the first-process pattern group.

The first region P1 of the substrate may include a plurality of active regions A. The plurality of active regions A may extend in a first direction. The active regions A may be parallel to each other while being spaced apart from one another. The active regions A may be electrically isolated from one another by an isolation trench and an isolation layer disposed between adjacent active regions A.

Each of gate patterns SSL, WL, and DSL may extend in a direction crossing the first direction, and may be formed on the first region P1. Each of the gate patterns SSL, WL, and DSL may be included in the first-process pattern group. The gate patterns may include a drain select line DSL, a source select line SSL, and word lines WL disposed between the drain select line DSL and the source select line SSL. The gate patterns SSL, WL, and DSL may be parallel to each other while being spaced apart from one another.

Each drain select transistor may be formed at each of intersections between the active regions A and the drain select line DSL. Each source select transistor may be formed at each of intersections between the active regions A and the source select line SSL. Each cell transistor may be formed at each of intersections between the active regions A and the word lines WL. The drain select transistor, the multiple cell transistors and the source select transistor formed along each of the active regions A may be electrically connected in series via junction regions each formed between adjacent transistors to form a memory string of the NAND flash memory device. Each of the junction regions may be formed by doping impurities into exposed active regions A between the gate patterns DSL, WL, and SSL.

The gate patterns SSL, WL, DSL on the first region P1 may be disposed in a first density. For example, each of the source select line SSL and the drain select line DSL may have a width larger than a width of each of the word lines WL. Further, a space between the word lines WL may be smaller than a space between the source select line SSL and its adjacent word line WL or a space between the drain select line DSL and its adjacent word line WL. As described above, the various widths and spaces of the gate patterns SSL, WL, and DSL may define the first density.

Although not illustrated in FIG. 2, gates of transistors of the driver circuits of the semiconductor device may be formed on the first region P1. The gates of transistors of the driver circuits may be included in the first-process pattern group. In an embodiment, a pattern density of the gate patterns SSL, WL, DSL and gate of transistors of the driver circuits on the first region P1 may be defined as the first density.

FIG. 3 is a plan view illustrating examples of vernier patterns and dummy patterns disposed on the second region of the substrate according to an embodiment of the present disclosure. FIG. 3 illustrates not only the first-process pattern group, but also the second-process pattern group.

Overlay vernier patterns OB and IB and dummy patterns DP may be formed on the second region P2 of the substrate. The overlay vernier patterns OB and IB may be used as an overlay vernier. The dummy patterns DP may surround the overlay vernier patterns OB and IB.

The overlay vernier patterns OB and IB may include first and second vernier patterns included respectively in the first-process and second-process pattern groups. For example, the overlay vernier patterns may include out-box patterns OB and an in-box pattern IB. The out-box patterns OB may be spaced apart from the in-box pattern IB and may surround the in-box pattern IB. The out-box patterns OB may include multiple bar-shaped patterns. However, the shapes of the out-box patterns OB are not limited thereto. The in-box pattern IB may be surrounded with the out-box patterns OB. The in-box pattern IB may include a rectangular-shaped pattern. However, the shape of the in-box pattern IB is not limited thereto.

One of the out-box pattern OB and the in-box pattern IB may define the first vernier pattern, and the other may define the second vernier pattern. In other words, one of the out-box pattern OB and the in-box pattern IB may be included in the first-process pattern group, and the other may be included in the second-process pattern group. Hereinafter, it may be assumed that the out-box pattern OB is included in the first-process pattern group, and the in-box pattern IB is included in the second-process pattern group for convenience purposes only and this example is not intended to limit the scope of the present disclosure.

After the first-process pattern group is formed, the second-process pattern group may be formed using a second masking process. An alignment between the first-process pattern group and the second-process pattern group may be measured by measuring the out-box pattern OB of the first-process pattern group and the in-box pattern IB of the second-process pattern group.

The dummy patterns DP may be disposed in a higher density than the overlay vernier patterns OB and IB. The dummy patterns DP may be included in the first-process pattern group. A second density of the first-process pattern group formed on the second region P2 may be higher than the first density of the first-process pattern group formed on the first region P1 as described above with reference to FIG. 2. In an embodiment, the dummy patterns DP may be disposed in a higher density than the gate patterns (e.g., SSL, DSL, and WL in FIG. 2) formed on the first region P1 (FIG. 1). The dummy patterns DP each may have a rectangular shape. Alternatively, the dummy patterns DP may have a mesh shape. However, the shapes of the dummy patterns DP are not limited thereto.

Hereinafter, with reference to FIG. 4A to FIG. 4F, a method of forming the first-process pattern group is described more specifically.

FIG. 4A to FIG. 4F are cross-sectional views for describing an example method of manufacturing a semiconductor device according to an embodiment of the present disclosure. FIG. 4A to FIG. 4F illustrate cross-sectional views taken along a line "I-I'" in FIG. 2 and a line "II-II'" in FIG. 3.

Figure 4A:
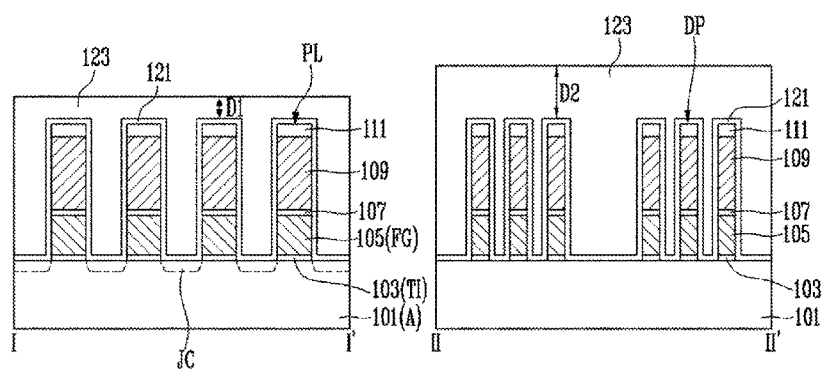
FIG. 4A to FIG. 4F are cross-sectional views for describing an example method of manufacturing a semiconductor device according to an embodiment of the present disclosure.

Referring to FIG. 4A, a first-process pattern group may be formed on a substrate 101 having an active region A defined by an isolation trench (not illustrated) or an isolation layer (not illustrated).

The first-process pattern group may include preliminary patterns PL formed on the first region of the substrate 101, and dummy patterns DP and a first vernier pattern (e.g., an out-box pattern OB illustrated in FIG. 3) formed on the second region of the substrate 101. Each pattern PL and DP of the first-process pattern group may include a silicon layer 109. More specifically, for example, the preliminary patterns PL may have the same layout as the gate patterns WL, DSL, and SSL and the gate patterns of the driver circuit of the NAND flash memory device as illustrated in FIG. 2. The preliminary gate patterns may be divided into word line preliminary patterns, a drain select line preliminary pattern, and a source select line preliminary pattern. Each of the preliminary patterns PL may include a first insulating layer 103, which will become a gate insulating layer or tunnel insulating layer, a data storage layer 105, which will become a floating gate FG, a dielectric layer 107, and a silicon layer 109, which will become a control gate. The first insulating layer 103, the data storage layer 105, the dielectric layer 107, and the silicon layer 109 may be stacked on top of each other over the substrate 101. For example, the first insulating layer 103 may be formed on the substrate 101, the data storage layer 105 may be formed on the first insulating layer 103, the dielectric layer 107 may be formed on the data storage layer 105, and the silicon layer 109 may be formed on the dielectric layer 107. A mask pattern 111 remaining on the silicon layer 109 may act as an etch barrier during a subsequent etch process that is performed to pattern the preliminary patterns PL.

At the same time as the formation of the preliminary patterns PL, dummy patterns DP and a first vernier pattern OB (FIG. 3) may be formed on the second region of the substrate 101. Each of the dummy patterns DP and the first vernier pattern OB (FIG. 3) may have the same stack configuration as that of each of the preliminary patterns PL. In other words, each of the dummy patterns DP and the first vernier pattern OB (FIG. 3) may include the first insulating layer 103, the data storage layer 105, dielectric layer 107, and the silicon layer 109, which are stacked on top of each other. In addition, each of the dummy patterns DP and the first vernier pattern OB (FIG. 3) may further include the mask pattern 111 on the silicon layer 109.

The dummy patterns DP may surround the first vernier pattern. The dummy patterns DP may be disposed in a higher density than the preliminary patterns PL. The density of the dummy patterns DP may be determined by considering the average density of the preliminary patterns PL formed on the first region of the substrate 101. More specifically, the density of the dummy patterns DP may be set such that an average density of the first vernier pattern and the dummy patterns DP on the second region of the substrate 101 is higher than the average density of the preliminary patterns PL on the first region of the substrate 101.

The first insulating layer 103 may include a silicon oxide layer or a silicon oxy-nitride layer. The data storage layer 105 may include an undoped polysilicon layer or a doped polysilicon layer. The dielectric layer 107 may include a first oxide layer, a nitride layer, and a second oxide layer, which are stacked on top of each other. In an embodiment, the second oxide layer of the dielectric layer 107 may include an oxide layer with a higher dielectric constant than the silicon oxide layer. Such an oxide layer with the higher dielectric constant may include an aluminum oxide layer ($Al_2O_3$) or the like. The silicon layer 109 may include an impurity-doped silicon layer. The mask pattern 111 may include a nitride layer.

The first-process pattern group including the preliminary patterns PL, the dummy patterns DP and the first vernier pattern may be formed in various ways. For example, the first insulating layer 103 and the data storage layer 105 may be stacked on the first region and second region of the substrate 101, and then may be patterned in the same way as a layout of the active region A. The substrate 101 of the first region may subsequently be partially etched to form an isolation trench (not illustrated) that may be filled with an isolation layer (not illustrated). Next, the dielectric layer 107 and the silicon layer 109 may be sequentially stacked on the resulting structure. The dielectric layer 107 may include contact holes (not illustrated) formed in regions where the source select line SSL and drain select line DSL (FIG. 2) will be formed. The contact holes may be filled with the silicon layer 109 to electrically connect the silicon layer 109 to the data storage layer 105 in the regions where the source select line SSL and drain select line DSL (FIG. 2) will be formed. Thereafter, the mask pattern 111 may be formed on the resulting structure. A layout of the mask pattern 111 may be identical with the layout of the preliminary patterns PL, the dummy patterns DP and the first vernier pattern. Subsequently, the silicon layer 109, the dielectric layer 107, and the data storage layer 105 may be etched through an etch process using the mask pattern 111 as an etch barrier. The first insulating layer 103 may be further etched. In this way, first-process pattern group may be formed.

If the preliminary patterns PL formed on the first region of the substrate 101 are preliminary gate patterns, a portion of the substrate 101 placed between adjacent preliminary patterns PL may be doped with impurities to form junction regions JC. Thereafter, an etch stop layer 121 may be formed along a surface of the first-process pattern group. The etch stop layer 121 may include a nitride layer. Before the formation of the etch stop layer 121, a sacrificial oxide layer (not illustrated) may be further formed.

A second insulating layer 123 may be formed on the etch stop layer 121 to cover the first-process pattern group PL and DP. The second insulating layer 123 may have different thicknesses on the first and second regions because the pattern density of the first-process pattern group PL formed on the first region of the substrate 101 is different from the pattern density of the first-process pattern group DP formed on the second region of the substrate 101. More specifically, the second insulating layer 123 formed on the first region of the substrate 101 and covering the preliminary patterns PL may have a first thickness D1. The second insulating layer 123 formed on the second region of the substrate 101 and covering the dummy patterns DP may have a second thickness D2. Here, the second thickness D2 may be larger than the first thickness D1. That is, the second insulating layer 123 may be thicker in the second region where the density of the first-process patterns is relatively high than in the first region where the density of the first-process patterns is relatively low.

The second insulating layer 123 may include a High Density Plasma (HDP) oxide layer. The second insulating layer 123 may fill spaces between the word line preliminary patterns PL and the dummy patterns DP of the first-process pattern group.

Figure 4B:
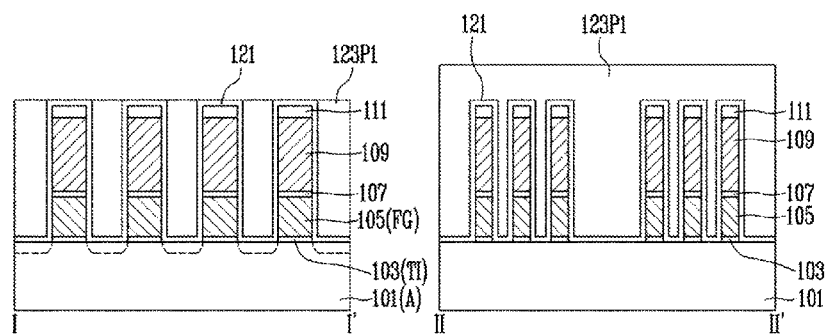

Referring to FIG. 4B, the second insulating layer 123 may be subjected to a planarization process such as a Chemical Mechanical Polishing (CMP) process. The planarization process may be performed until the etch stop layer 121 may be partially exposed on the first region of the substrate 101. The planarization process may be performed such that the etch stop layer 121 formed on the second region of the substrate 101 remains completely covered with the remaining second insulating layer 123. In other words, the planarization process may be carried out such that the remaining second insulating layer 123 may be thicker in an area where the density of the first-process patterns is higher, which is the second region, than in an area where the density of the first-process patterns is lower, which is the first region.

Through the planarization of the second insulating layer 123P1, the etch stop layer 121 formed on the first region of the substrate 101 may be partially exposed, whereas the etch stop layer 121 formed on the second region of the substrate 101 may be completely covered with the remaining planarized second insulating layer 123P1.

Figure 4C:
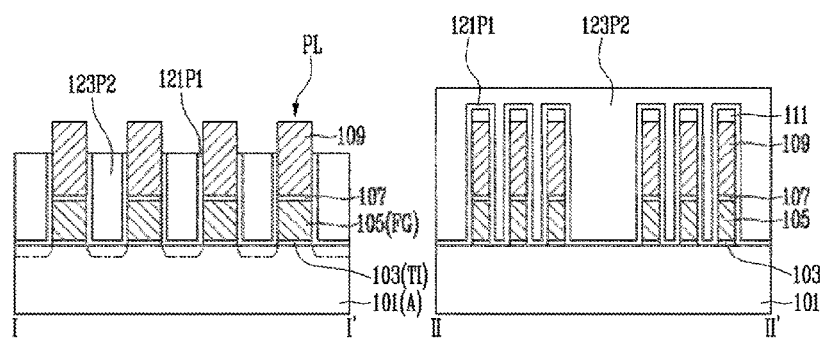

Referring to FIG. 4C, the planarized second insulating layer 123P1 and the etch stop layer 121 may be etched back using an anisotropic dry etch process to form an insulating pattern 123P2 and an etch stop pattern 121P1. As a result, the mask pattern 111 formed on the first region of the substrate 101 may be removed.

The insulating pattern 123P2 and the etch stop pattern 121P1 formed on the first region of the substrate 101 may have a lower height than the preliminary patterns PL, and hence the silicon layer 109 formed on the first region of the substrate 101 may be partially exposed. In an embodiment, the height of the insulating pattern 123P2 may be controlled to be greater than the level of the dielectric layer 107.

The insulating pattern 123P2 and the etch stop pattern 121P1 may remain on the second region of the substrate 101 to completely cover the silicon layer 109 of the dummy patterns DP and the first vernier pattern, for example, the out-box pattern OB (FIG. 3). Thus, the dummy patterns DP and first vernier pattern may not be exposed.

In an embodiment of the present disclosure, the insulating pattern 123P2 remaining in the second region of the substrate 101 may be thicker than the insulating pattern 123P2 remaining in the first region of the substrate 101. Thus, the silicon layer 109 formed on the second region may be covered with the insulating pattern 123P2, whereas the silicon layer 109 formed on the first region may be exposed partially. In an embodiment of the present disclosure, the first-process pattern group may be integrated more highly in the second region than in the first region, and thus the deposition thickness of the second insulating layer 123 on the first and second regions may be different from one another. Thus, the insulating pattern 123P2 remaining on the second region may be thicker than the insulating pattern 123P2 remaining on the first region.

Figure 4D:
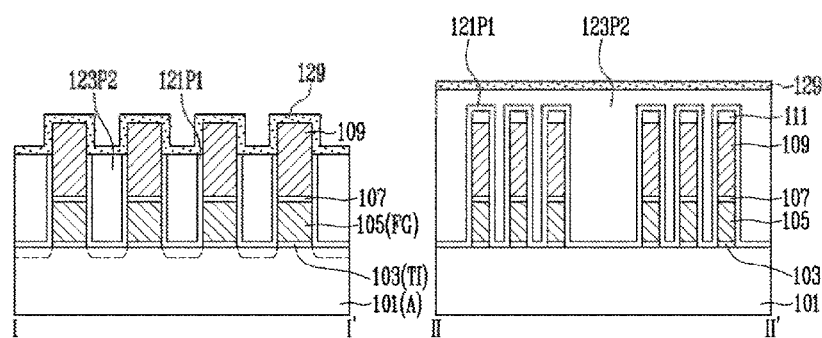

Referring to FIG. 4D, on the resulting structure where the silicon layer 109 on the first region is exposed, and the silicon layer 109 on the second region is covered with the insulating pattern 123P2, a metal layer 129 may be formed. An anti-oxidation layer (not illustrated) may be further formed on the metal layer 129. The metal layer 129 may include a cobalt or nickel. The anti-oxidation layer (not illustrated) may include a titanium nitride layer TiN.

Figure 4E:
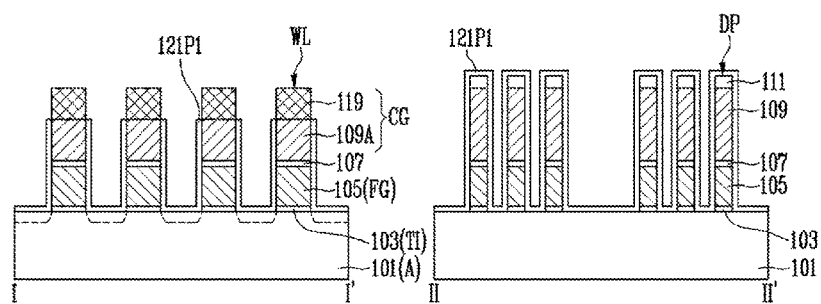

Referring to FIG. 4E, heat may be applied to the resulting structure for a silicidation process. Thus, the silicon layer 109 on the first region of the substrate 10 may partially react with the metal layer 129, and hence the silicon layer 109 on the first region may be partially changed into a silicide layer 119. As a result, an unchanged silicon layer 109A and the silicide layer 119 formed on the unchanged silicon layer 109A, which are formed on the first region of the substrate 101, may form a control gate CG. The control gate CG may be the gate pattern such as the word lines WL, the source select line SSL, the drain select line DSL (FIG. 2), and may be the gates of the driver circuit. The partial conversion of the silicon layer 109 into the silicide layer 119 may reduce a resistance of the gate patterns.

The silicidation may occur between the silicon layer 109 and the metal layer 129 by a thermal energy. Then, a portion of the metal layer 129 that has not reacted with the silicon layer 109 may be removed. The silicidation may occur at an interface between the silicon layer 109 and the metal layer 129. In an embodiment of the present disclosure, as illustrated in FIG. 4D, on the second region, the insulating pattern 123P2 may remain between the silicon layer 109 and the metal layer 129 to prevent the silicon layer 109 from converting to the silicide layer.

An agglomeration may occur in the silicide layer 119 resulting from the silicidation. The agglomeration may cause an error in the overlay measurement. However, in an embodiment of the present disclosure, on the second region, the silicidation may be suppressed, and the probability of agglomeration in the first vernier pattern, for example, the out-box pattern OB (FIG. 3) formed on the second region, may decrease.

After the formation of the silicide layer 119, the insulating pattern 123P2 may be removed.

Figure 4F:
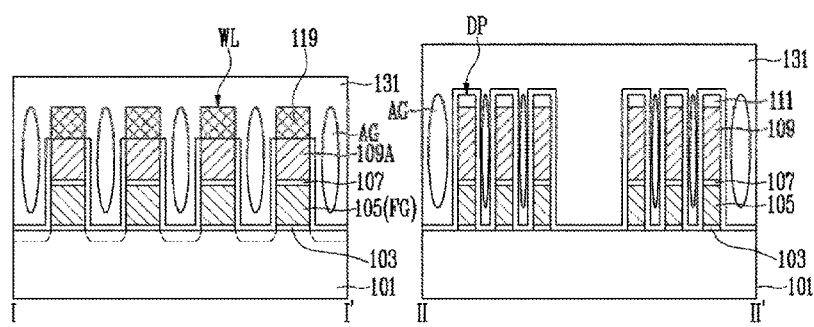

Referring to FIG. 4F, a third insulating layer 131 may be formed such that an air gap AG may be formed in the third insulating layer 131 between adjacent patterns of the first-process pattern group including the silicide layer 119.

Then, a subsequent process may proceed using, as an overlay vernier, the first vernier pattern, for example, the out-box pattern OB (FIG. 3) having the same stack structure as each of the dummy patterns DP.

For example, as the subsequent process, a further masking process may be performed to form a contact hole (not illustrated) in the third insulating layer 131 on the first region of the substrate 101. In an embodiment, in addition to the formation of the contact hole, a second vernier pattern, for example, the in-box pattern IB (FIG. 3) may be formed in the third insulating layer 131 on the second region of the substrate 101. In other words, the contact hole and second vernier pattern IB may be included in the second-process pattern group.

Thereafter, an alignment of the first vernier pattern OB (FIG. 3) and second vernier pattern IB (FIG. 3) may be checked. In an embodiment of the present disclosure, since the first vernier pattern OB may be protected from the silicidation, the probability of agglomeration in the first vernier pattern OB may decrease, and the probability of error in the measurement of the first vernier pattern OB may also decrease. As a result, a more reliable overlay measurement may increase yield of the semiconductor device.

With respect to a comparison example where the density of the dummy patterns DP is not controlled, the vernier pattern acting as the overlay vernier may be subjected to the silicidation. In this connection, a silicide layer may be selectively removed from the vernier pattern to reduce the probability of error in the overlay measurement. In an embodiment of the present disclosure, the vernier pattern may be prevented from the silicidation, and hence the probability of error in the overlay measurement may decrease without additional masking processes for selectively removing the silicide layer.

Figure 5:
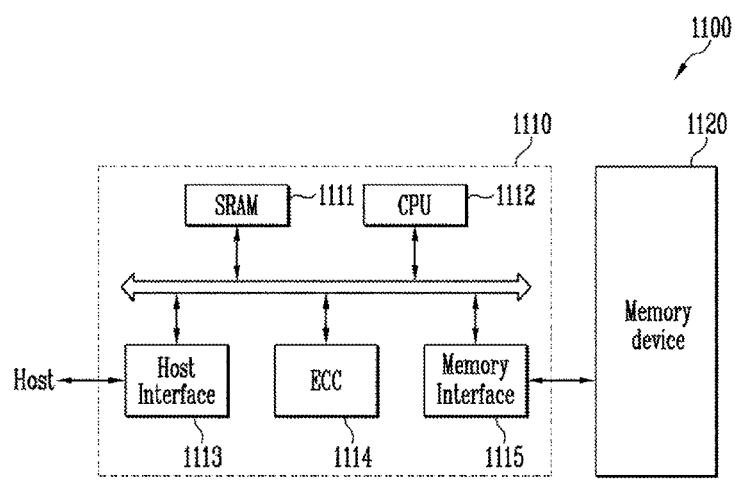
FIG. 5 is a diagram illustrating an example of a memory system in accordance with an embodiment.

FIG. 5 is a diagram illustrating an example of a memory system in accordance with an embodiment.

Referring to FIG. 5, the memory system 1100 may include a semiconductor memory device 1120 and a memory controller 1110.

The semiconductor memory device 1120 may be formed in a controlled manner such that the silicon layer of the patterns acting as the overlay vernier may be protected from the silicidation, as illustrated above in connection to FIG. 4A to FIG. 4F. Further, the memory device 1120 may be implemented as a multi-chip package including a plurality of flash memory chips.

The memory controller 1110 may control the memory device 1120, and may include a SRAM 1111, CPU 1112, host interface 1113, ECC 1114, and memory interface 1115. The SRAM 1111 may act as a work memory for the CPU 1112. The CPU 1112 may control operations for data exchange of the memory controller 1110. The host interface 1113 may have a data exchange protocol between the memory system 1100 and a host system coupled to the memory system 1100. Further, the ECC 1114 may detect and correct an error in data read from the memory device 1120. The memory interface 1115 may interface the memory device 1120. In addition, the memory controller 1110 may further include a ROM to store code data to interface the host system.

The memory system 1100 may be implemented in a memory card or Solid State Disk (SSD) as a combination of the memory device 1120 and controller 1110. In one example, when the memory system 1100 is implemented as the SSD, the memory controller 1110 may communicate with an external device (e.g., host system) via various interface protocols such as USB, MMC, PCI-E, SATA, PATA, SCSI, ESDI, IDE, etc.

Figure 6:
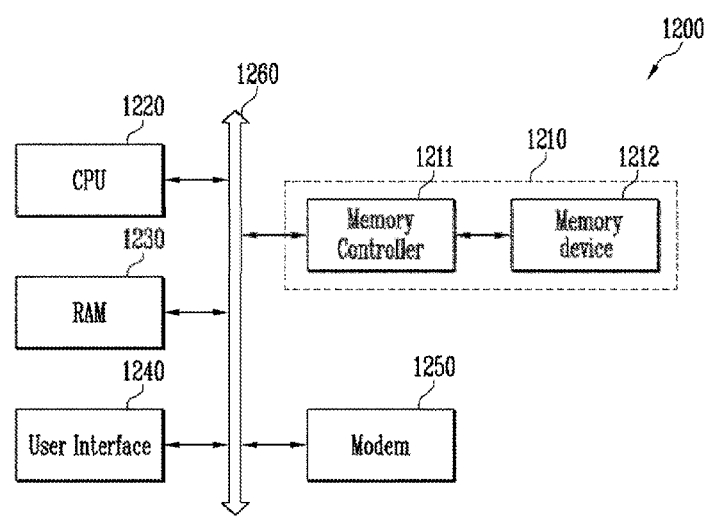
FIG. 6 is a diagram illustrating an example of a computing system in accordance with an implementation of the present disclosure.

FIG. 6 is a diagram illustrating an example of a computing system in accordance with an implementation of the present disclosure.

Referring to FIG. 6, the computing system 1200 in accordance with an implementation of the present disclosure may include a CPU 1220, RAM 1230, user interface 1240, modem 1250, and memory system 1210, all of which are electrically connected to each other via a system bus 1260. Further, when the computing system 1200 is implemented in a mobile device, the computing system 1200 may be further provided with a battery (not illustrated) to supply an operation voltage thereof, and may be further provided with an application chipset, camera image processor (CIS), mobile DRAM, etc.

The memory system 1210 may include the memory device 1212, and the memory device controller 1211.

In an embodiment of the present disclosure, the silicon layer of the pattern acting as the overlay vernier may be protected by the insulating pattern from the silicidation process, and hence the agglomeration at the overlay vernier commonly resulting from the silicidation process may be minimized. As a result, the probability of error in an overlay measurement may also decrease.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of manufacturing a semiconductor device, comprising:
    forming a pattern group on a substrate, the substrate being divided into first and second regions, each pattern including a silicon layer;
    forming an insulating layer over the substrate to cover the pattern group, wherein a deposition thickness of the insulating layer on the second region is larger than that of the insulating layer on the first region;
    forming an insulating pattern by etching the insulating layer, the insulating pattern partially exposing the silicon layer on the first region and blocking the silicon layer on the second region;
    converting the exposed silicon layer on the first region to a silicide layer while the blocked silicon layer on the second region is protected from the conversion; and
    performing a subsequent process using, as an overlay vernier, at least a portion of the pattern group formed on the second region.

2. The method of claim 1, wherein the pattern group on the second region is disposed in a higher pattern density than the pattern group on the first region.

3. The method of claim 2, wherein the pattern group comprises:
    preliminary patterns on the first region;
    a vernier pattern formed on the second region, the vernier pattern acting as an overlay vernier; and
    dummy patterns formed on the second region, the dummy patterns surrounding the vernier pattern, the dummy patterns being disposed in a higher density than the preliminary patterns.

4. The method of claim 2, wherein forming the pattern group comprises:
    forming a data storage layer on the substrate;
    forming a dielectric layer on the data storage layer;
    forming the silicon layer on the dielectric layer; and
    etching the silicon layer, the dielectric layer, and the data storage layer to form preliminary gate patterns on the first region and to form a vernier pattern and dummy patterns on the second region, wherein the vernier pattern acts as the overlay vernier, and the dummy patterns surround the overlay vernier pattern.

5. The method of claim 2, wherein the pattern density difference between the pattern group on the first region and the pattern group on the second region induces a difference between the deposition thicknesses of the insulating layer on the first and second regions.

6. The method of claim 1, further comprising, prior to the formation of the insulating layer, forming an etch stop layer on a surface of the pattern group.

7. The method of claim 6, further comprising, after the formation of the insulating layer:
    planarizing the insulating layer until the etch stop layer is partially exposed on the first region; and
    etching the exposed etch stop layer using an etch-back process.

8. The method of claim 7, wherein planarizing the insulating layer is performed such that the insulating layer remains on the etch stop layer of the second region.

9. The method of claim 1, wherein converting the exposed silicon layer comprises:
    forming a metal layer on the silicon layer; and
    applying heat to cause the metal layer and the silicon layer on the first region to react with each other to form the silicide layer.

10. The method of claim 9, wherein the insulating pattern remains between the metal layer and the silicon layer on the second region.

11. A method of manufacturing a semiconductor device, comprising:
    forming preliminary patterns on a first region of a substrate, wherein the first region includes a chip region;
    forming an overlay vernier pattern on a second region of the substrate;
    forming dummy patterns on the second region, a density of the dummy patterns being higher than that of the preliminary patterns such that a pattern density difference is induced between the first region and the second region; and
    forming an insulating pattern on the first and second regions of the substrate, the insulating pattern partially exposing the preliminary patterns on the first region and covering the overlay vernier pattern on the second region.

12. The method of claim 11, further comprising performing a conversion process on the preliminary patterns, wherein the overlay vernier pattern on the second region is protected from the conversion while converting the preliminary patterns.

13. The method of claim 12, wherein the conversion process comprises:
    forming a metal layer over the substrate; and
    applying heat to cause the metal layer and a silicon layer formed on the first region to react with each other to form a silicide layer.

14. The method of claim 11, wherein forming the insulating pattern comprises:
    forming an insulating layer such that the insulating layer formed on the second region has a larger thickness than the insulating layer formed on the first region; and
    etching the insulating layer to form the insulating pattern.

* * * * *